United States Patent
Park et al.

(10) Patent No.: US 7,800,950 B2
(45) Date of Patent: Sep. 21, 2010

(54) MEMORY DEVICES AND METHODS USING SELECTIVE SELF-BOOST PROGRAMMING OPERATIONS

(75) Inventors: Jong-Yeol Park, Gyeonggi-do (KR); Sang-Won Hwang, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 679 days.

(21) Appl. No.: 11/693,119

(22) Filed: Mar. 29, 2007

(65) Prior Publication Data
US 2008/0037327 A1 Feb. 14, 2008

(30) Foreign Application Priority Data
Aug. 10, 2006 (KR) ................. 10-2006-0075712

(51) Int. Cl.
G11C 11/34 (2006.01)
G11C 16/04 (2006.01)

(52) U.S. Cl. .............. 365/185.19; 365/185.17; 365/185.18; 365/185.23

(58) Field of Classification Search ........... 365/185.17, 365/185.18, 185.19, 185.23, 185.33
See application file for complete search history.

(56) References Cited

U.S. PATENT DOCUMENTS

| | | | |
|---|---|---|---|
| 5,677,873 A | 10/1997 | Choi et al. | |
| 5,715,194 A | 2/1998 | Hu | |
| 6,061,270 A | 5/2000 | Choi | |
| 6,107,658 A * | 8/2000 | Itoh et al. | 257/315 |
| 7,161,833 B2 * | 1/2007 | Hemink | 365/185.18 |
| 7,327,606 B2 * | 2/2008 | Lee | 365/185.17 |
| 7,376,017 B2 * | 5/2008 | Kim | 365/185.23 |
| 2005/0174852 A1 | 8/2005 | Hemink | |
| 2006/0291290 A1 | 12/2006 | Kim et al. | |
| 2007/0258286 A1 * | 11/2007 | Higashitani | 365/185.14 |

FOREIGN PATENT DOCUMENTS

| | | |
|---|---|---|
| JP | 10-302488 A | 11/1998 |
| JP | 11-273376 A | 10/1999 |
| JP | 2001-015717 | 1/2001 |
| KR | 1020030089548 A | 11/2003 |
| KR | 10-2005-0062060 | 6/2005 |
| KR | 10-2006-0037648 | 5/2006 |
| KR | 10-2006-0061088 | 6/2006 |

OTHER PUBLICATIONS

Notice of Allowance for Korean patent application No. 2006-75712; Jul. 26, 2007.
English translation of Notice of Allowance for Korean patent application No. 2006-75712; Jul. 26, 2007.

* cited by examiner

Primary Examiner—Tuan T Nguyen
Assistant Examiner—Toan Le
(74) Attorney, Agent, or Firm—Myers Bigel Sibley & Sajovec, P.A.

(57) ABSTRACT

In a flash memory device, different self-boosting techniques are selectively applied to a string of serially connected memory cells responsive to a programming voltage applied to a selected word line. For example, non-local self-boosting and local self-boosting may be selectively applied responsive to the programming voltage applied to the selected word line. For example, non-local self-boosting and local self-boosting may be selectively applied to a first string of serially-connected cells responsive to the programming voltage during an incremental step pulse programming (ISPP) of a selected cell of a second string of serially-connected cells.

25 Claims, 11 Drawing Sheets

MEMORY DEVICES AND METHODS USING SELECTIVE SELF-BOOST PROGRAMMING OPERATIONS

CROSS-REFERENCE TO RELATED APPLICATION

This application claims the benefit of Korean Patent Application No. 2006-0075712, filed Aug. 10, 2006, the disclosure of which is hereby incorporated herein by reference in its entirety.

BACKGROUND

The present invention relates flash memory devices and methods of operation thereof and, more particularly, to programming of flash memory devices.

Flash memory devices are used for data storage applications in a wide variety of electronic devices, for example, in computer memory cards, solid-state storage devices (e.g., USB memory keys), digital cameras, media player devices and cellular telephones. A common flash memory type is the so called NAND flash memory, in which columns comprise serially-connected strings of floating gate transistor devices are configured to be connected to respective bit lines and have rows of control gates that are connected in parallel to common word lines.

Operations conducted on such devices typically include programming, erasing and reading. Programming of floating-gate transistor cell of a flash memory device is typically achieved by biasing the drain region of the cell to a first positive bias, relative to the source region, and biasing the control gate of the device to a second positive bias which is greater than the first positive bias. In the absence of any stored charge on the floating gate, these biases cause the formation of an inversion-layer channel of electrons at the face of the substrate, between the source and drain regions. The drain-to-source voltage accelerates these electrons through the channel to the drain region where they acquire sufficiently large kinetic energy and are typically referred to as "hot" electrons. The larger positive bias on the control gate also establishes an electrical field in a tunneling oxide layer that separates the floating gate from the channel region. This electric field attracts the hot electrons and accelerates them toward the floating gate, which is disposed between the control gate and the channel region, by a process known as tunneling. The floating gate then accumulates and traps the accumulated charge.

The accumulation of a large quantity of trapped charge (electrons) on the floating gate will cause the effective threshold voltage of the transistor to increase. If this increase is sufficiently large, the transistor will remain in a nonconductive "off" state when a predetermined "read" voltage is applied to the control gate during a read operation. In this state, known as the programmed state, the cell may be said to be storing a logic "0." Once programmed, the device typically retains its higher threshold voltage even when its power supply is interrupted or turned off for long periods of time.

Reading of the cell may be achieved by applying a predetermined read voltage to the control gate, typically via a word line connecting a row of identical cells, and applying a positive bias to the drain region, typically via a bit line connecting a column of identical cells. If the cell is programmed, it will not conduct drain current. However, if the cell is not programmed (or has been erased), it will conduct. In this state, the cell may be said to be storing a logic "1." Thus, by monitoring the bit line current, the state of a cell can be determined.

Erasure of a cell may be achieved by removing the stored charge from the floating gate. The erasure process can be achieved, for example, by grounding the control gate and applying a positive bias to the substrate (e.g., 10-20 Volts). Typically, flash memory devices employ bulk erasure of large numbers of cells.

As noted above, a NAND flash memory device may be arranged as plural columns including serially connected strings of cells. To program a cell within a NAND string, the bit line associated with the string is grounded. The select transistor connecting the string to a bit line is then turned "on" and all of the cells in the string other than the cell to be programmed are turned on by a applying a pass voltage (e.g., 10 volts) to their word lines sufficient to turn on the cells without causing tunneling. A higher program voltage (e.g., 18 volts) is applied to the word line of the cell to be programmed, such that tunneling occurs between the channel of the cell and its floating gate.

In a technique referred to an incremental step pulse programming (ISPP), the program voltage applied to the control gate of a cell to be programmed is incrementally increased until the cell threshold voltage reaches a desired level. In particular, the program voltage is applied at a first level, after which the threshold voltage of the cell to be programmed is checked (read) to determine whether the cell is properly programmed. If the verification fails, the program voltage is increased, followed by another round of verification. The program voltage may be incrementally increased in this manner until the desired threshold voltage is achieved. In this manner, overprogramming of the cell may be reduced or avoided.

In a NAND flash device, the word line for a cell to be programmed is also connected to cells in other strings. Typically, these other cells are biased to reduce or prevent inadvertent programming. In particular, a voltage may be applied to the channels of these "program inhibited" cells to raise their channel potentials and, thus, reduce the voltage between their channels and gate electrodes when the program voltage is applied to their control gates.

Techniques have been developed to boost channel voltages of program-inhibited cells to further reduce the likelihood of inadvertent programming. In "self-boost" techniques, cells in a non-selected string of cells are first connected to a power supply voltage via a string select transistor and bit line such that their channels are raised to the power supply voltage. Thereafter, the string select transistor turns off, and the pre-charged channels float. Then, when the programming voltage is applied to a selected cell and a program-inhibited cell in the non-selected string that shares the same word line, the voltage of the channel of the program-inhibited cell rises. This can help prevent the voltage between its control gate and channel from becoming sufficiently great enough to support tunneling between the channel and the floating gate electrode of the program-inhibited cell.

A potential problem with such self-boosting techniques may occur when a cell connected to the program inhibited cell has already been programmed. As noted above, programming typically increases the threshold voltage of a cell transistor. Thus, when the above-described self-boost technique is used, the channel voltage of a programmed-inhibited cell connected to an already-programmed cell may be appreciably lower than the channel voltage of a non-programmed cell when the program voltage is applied to the control gate of the program-inhibited cell. This may cause a greater voltage to develop between the control gate and the channel of the program-inhibited cell, which can lead to tunneling between the channel and the floating gate of the program-inhibited cell. Thus, inadvertent programming of the program-inhibited cell may occur, a phenomenon referred to as "program disturb."

A technique for reducing the likelihood of program disturb is referred to as "local self-boost." In such a technique, a lower voltage (e.g., 0 volts) is applied to the control gate of a cell adjacent the program-inhibited cell after application of the pass voltage and before application of the program voltage, such that the channel(s) of an already-programmed cell(s) is decoupled from the program-inhibited cell after the channels of the cells in the string are precharged. This allows the channel voltage of the program-inhibited cell to rise independently of the threshold voltage of the already-programmed cell when the program voltage is applied, thus limiting the voltage between the control gate and the channel of the program-inhibited cell. A potential problem of such a technique, however, is that it may require additional time for sequential application of pass and decoupling voltages, which can increase programming time. Techniques for self-boosting are described, for example, in U.S. Pat. No. 5,677,873 to Choi et al., while techniques employing local self-boosting are described in, for example, U.S. Pat. No. 5,715,194 to Hu and U.S. Pat. No. 6,061,270 to Choi.

SUMMARY

Some embodiments of the present invention provide methods of operating flash memory devices. According to some embodiments, different self-boosting techniques are selectively applied to a string of serially connected memory cells responsive to a programming voltage applied to a selected word line. For example, selectively applying different self-boosting techniques to a string of serially-connected memory cells responsive to a programming voltage applied to a selected word line may include selectively applying non-local self boosting and local self-boosting responsive to the programming voltage applied to the selected word line. For example, non-local self-boosting and local self-boosting may be selectively applied to a first string of serially-connected cells responsive to the programming voltage during an incremental step pulse programming (ISPP) of a selected cell of a second string of serially-connected cells.

Further embodiments of the present invention provide methods of operating a flash memory device that includes a string of memory cells configured to be connected in series between a bit line and a source line. A programming voltage is applied at a first level to a selected word line that controls a program inhibited cell while applying a pass voltage to word lines that control upstream cells coupled between the bit line and the program inhibited cell and word lines that control downstream cells coupled between the source line and the program inhibited cell. The programming voltage is subsequently applied to the selected word line at a second level different than the first level while applying a pass voltage to the word lines that control the upstream cells and applying a decoupling voltage to a word line that controls one of the downstream cells. Subsequently applying the programming voltage to the selected word line at a second level different than the first level while applying a pass voltage to the word lines that control the upstream cells and applying a decoupling voltage to a word line that controls one of the downstream cells may include changing the programming voltage from the first level to the second level and, responsive to determining that the second level meets a predetermined criterion, applying the programming voltage to the selected word line at the second level while applying the pass voltage to the word lines that control the upstream cells and applying the decoupling voltage to a word line that controls one of the downstream cells. The predetermined criterion may include a voltage threshold criterion.

In further embodiments, subsequently applying the programming voltage to the selected word line at a second level different than the first level while applying a pass voltage to the word lines that control the upstream cells and applying a decoupling voltage to a word line that controls one of the downstream cells includes subsequently applying the programming voltage to the selected word line at a second level different than the first level while applying a pass voltage to the word lines that control the upstream cells, applying a decoupling voltage to a word line that controls a first downstream cell immediately downstream of the program inhibited cell and applying the pass voltage to a word line that controls a second downstream cell. In some embodiments, subsequently applying the programming voltage to the selected word line at a second level different than the first level while applying a pass voltage to the word lines that control the upstream cells and applying a decoupling voltage to a word line that controls one of the downstream cells includes subsequently applying the programming voltage to the selected word line at a second level different than the first level while applying a pass voltage to the word lines that control the upstream cells, applying a decoupling voltage to a word line that controls a first downstream cell immediately downstream of the program inhibited cell and applying a voltage other than the pass voltage, the programming voltage and the decoupling voltage to a word line that controls a second downstream cell.

In further embodiments, applying a programming voltage at a first level to a selected word line that controls a program inhibited cell while applying a pass voltage to word lines that control upstream cells coupled between the bit line and the program inhibited cell and word lines that control downstream cells coupled between the source line and the program inhibited cell may be preceded by generating the programming voltage at the first level and comparing the first level to a programming voltage threshold. Applying a programming voltage at a first level to a selected word line that controls a program inhibited cell while applying a pass voltage to word lines that control upstream cells coupled between the bit line and the program inhibited cell and word lines that control downstream cells coupled between the source line and the program inhibited cell may include applying a channel bias voltage to the bit line while applying the programming voltage at the first level to the selected word line and applying the pass voltage to the word lines that control the upstream and downstream cells responsive to the first level being less than the programming voltage threshold. Subsequently applying the programming voltage to the selected word line at a second level different than the first level while applying a pass voltage to the word lines that control the upstream cells and applying a decoupling voltage to a word line that controls one of the downstream cells may be preceded by performing a threshold voltage test for a selected cell of a second string of serially-connected cells, responsive to determining that a threshold voltage of the selected cell fails to meet a transistor threshold voltage criterion, changing the programming voltage to the second level, and comparing the second level to the programming voltage threshold. Subsequently applying the programming voltage to the selected word line at a second level different than the first level while applying a pass voltage to the word lines that control the upstream cells and applying a decoupling voltage to a word line that controls one of the downstream cells may include applying the programming voltage to the selected word line at the second level while applying the pass voltage to the word lines that control the upstream cells and applying the decoupling voltage to the word line that controls the one of the downstream cells responsive to the second level being greater than the programming voltage threshold.

In additional embodiments of the present invention, a flash memory device includes a plurality of strings of serially connected memory cells that share word lines. A program circuit is configured to selectively apply different self-boosting techniques to a program-inhibited string of the plurality of strings responsive to a programming voltage applied to a selected word line. The program circuit may be configured to selectively apply non-local self-boosting and local self-boosting responsive to the programming voltage applied to the selected word line. The program circuit may be configured to conduct incremental step pulse programming (ISPP) and to selectively apply non-local self-boosting and local self-boosting to a first string of serially-connected memory cells responsive to the programming voltage during ISPP of a selected cell of a second string of serially-connected cells.

In still further embodiments of the present invention, a flash memory device includes a plurality of strings of serially-connected memory cells that share word lines, each string of memory cells configured to be connected in series between a bit line and a source line. The memory device further includes a program circuit configured to apply a programming voltage at a first level to a selected word line that controls a program inhibited cell while applying a pass voltage to word lines that control upstream cells coupled between the bit line and the program inhibited cell and word lines that control downstream cells coupled between the source line and the program inhibited cell and to subsequently apply the programming voltage to the selected word line at a second level different than the first level while applying a pass voltage to the word lines that control the upstream cells and applying a decoupling voltage to a word line that controls one of the downstream cells.

DETAILED DESCRIPTION

Figure 1:
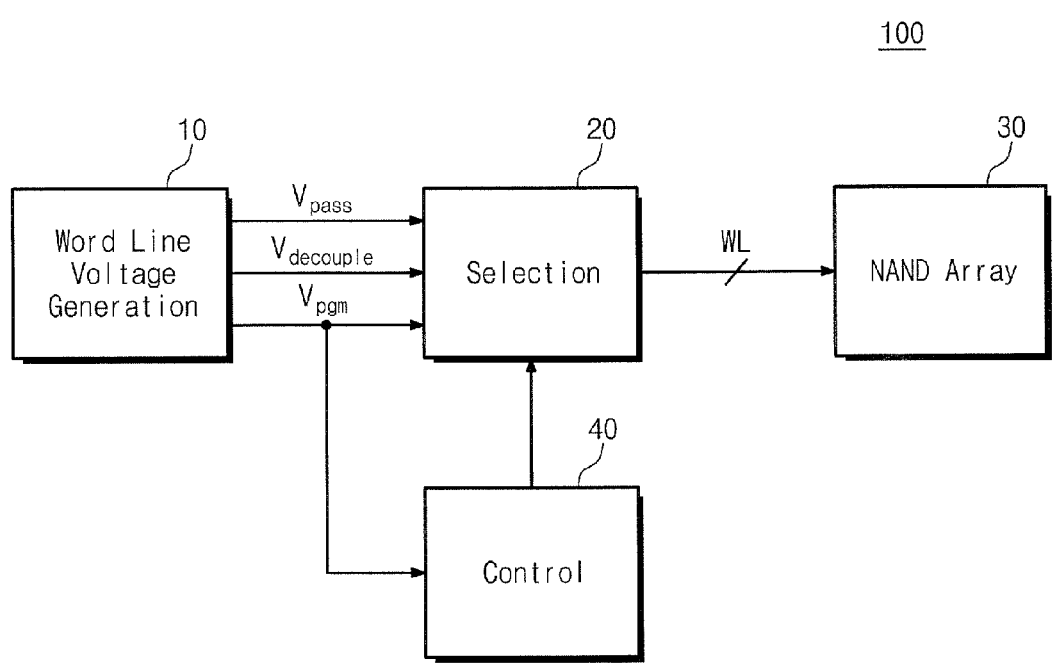
FIG. 1 is a schematic diagram illustrating a memory device according to some embodiments of the present invention.

The invention is described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the sizes or configurations of elements may be idealized or exaggerated for clarity.

It will be understood that when an element is referred to as being "connected to" or "coupled to" another element, it may be directly connected or coupled to the other element or intervening elements may be present. In contrast, when an element is referred to as being "directly connected to" or "directly coupled to" another element, there are no intervening elements present. Like numbers refer to like elements throughout. As used herein, the term "and/or" includes any and all combinations of one or more of the associated listed items.

It will be understood that, although the terms first, second, third etc. may be used herein to describe various elements, components and/or sections, these elements, components and/or sections should not be limited by these terms. These terms are only used to distinguish one element, component, or section from another element, region or section. Thus, a first element, component or section discussed below could be termed a second element, component or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and this specification, and will not be interpreted in an idealized or overly formal sense unless expressly so defined herein.

Some embodiments of the present invention arise from a realization that the risk of program disturb generally increases with increasing program voltage, and that more complex and time consuming local self-boosting operations may not be necessary to prevent or reduce program disturb at relatively low program voltage levels. Some embodiments of the present invention may advantageously use incremental programming techniques, such as ISPP, in conjunction with selective self-boosting based on program voltage level to achieve a desirable tradeoff between programming speed and risk of program disturb.

FIG. 1 illustrates a memory device 100 and operations thereof according to some embodiments of the present invention. The device 100 includes a memory cell array 30 that includes a plurality of NAND strings of flash memory cells, rows of which are controlled by respective word lines WL. The device 100 further includes a word line voltage generation circuit 10 that is configured to generate a plurality of different voltages, including a program voltage $V_{pgm}$, a pass voltage $V_{pass}$ and a decoupling voltage $V_{decouple}$. A selection circuit 20 is configured to selectively apply the program voltage $V_{pgm}$, pass voltage $V_{pass}$ and decoupling voltage $V_{decouple}$ to the word lines WL. responsive to a control input generated by a control circuit 40 responsive to the program voltage $V_{pgm}$.

In particular, the control circuit 40 is configured to control application of the program voltage $V_{pgm}$, pass voltage $V_{pass}$ and decoupling voltage $V_{decouple}$ to the array 30 responsive to the level of the program voltage $V_{pgm}$. For example, in some embodiments, the word line voltage generation circuit 10 may be configured to incrementally increase the program voltage $V_{pgm}$, in an ISPP process. The control circuit 40 may be configured, for example, to compare the program voltage $V_{pgm}$ to one or more predetermined thresholds to identify which of a plurality of different self-boosting techniques is to be applied in programming a cell of the array 30, for example, to determine whether to apply the program voltage $V_{pgm}$, pass voltage $V_{pass}$ and decoupling voltage $V_{decouple}$ to effect non-local self-boosting or a local self-boosting.

Figure 2:
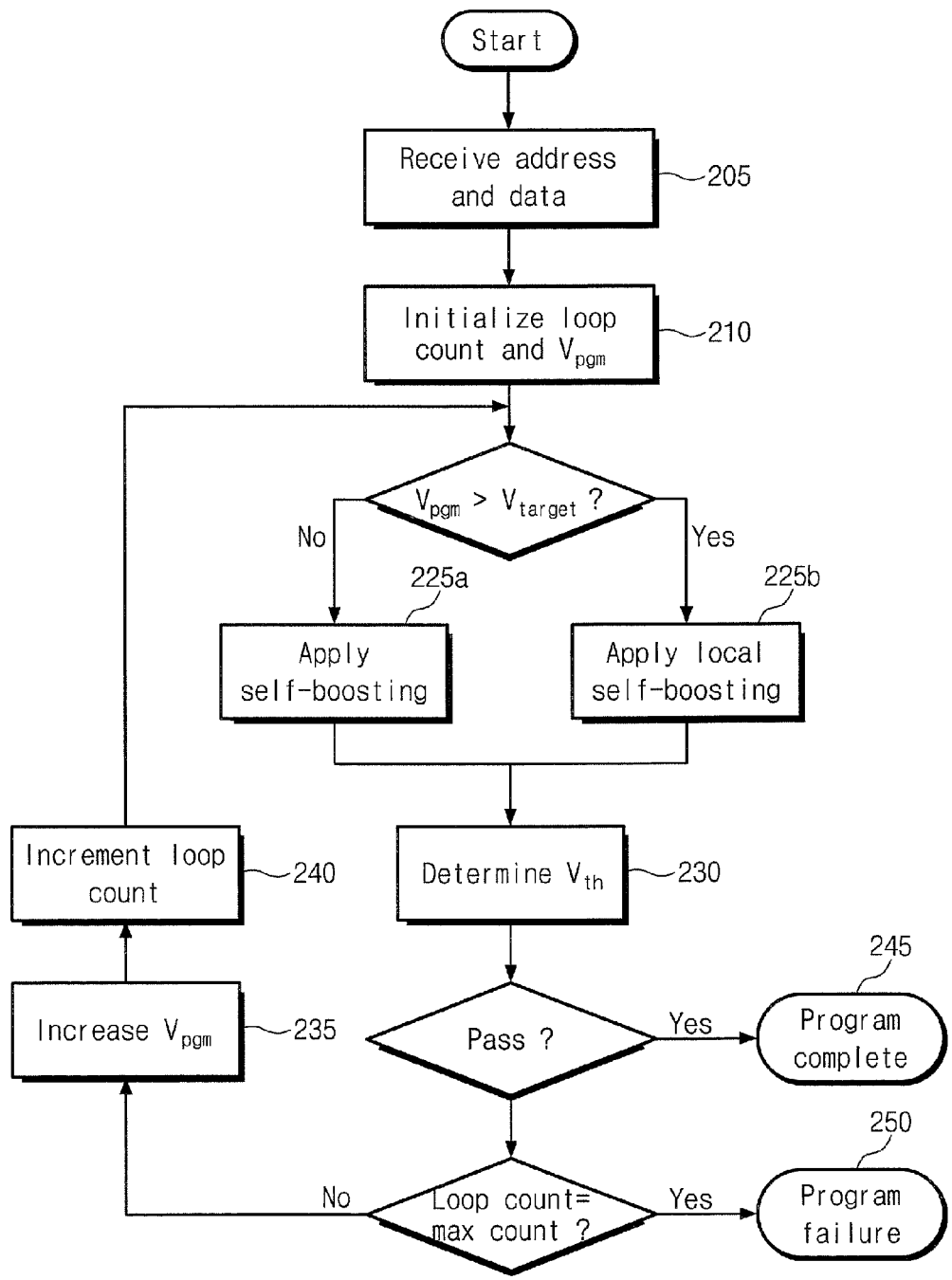
FIG. 2 is a flowchart illustrating exemplary operations of the memory device of FIG. 1.

FIG. 2 is a flowchart illustrating exemplary operations of the memory device 100 according to further embodiments of the present invention. Responsive to receipt of address and data for programming a selected cell (block 205), the control circuit 40 initializes a loop count and program voltage $V_{pgm}$ (block 210). If the program voltage $V_{pgm}$ is less than a target voltage $V_{target}$, the control circuit 40 causes the selection circuit 20 to apply the program voltage $V_{pgm}$ and pass voltage $V_{pass}$ to the word lines WL such that non-local self-boosting is applied, e.g., the program voltage $V_{pgm}$ is applied to the word line of the selected cell while the pass voltage $V_{pass}$ is applied to all of the other word lines (block 225a). If the program voltage $V_{pgm}$ is greater than the target voltage $V_{target}$, however, the control circuit 40 causes the selection circuit 20 to apply the program voltage $V_{pgm}$, pass voltage $V_{pass}$ and decoupling voltage $V_{decouple}$ to effect local self-boosting (block 225b).

After application of the word line voltages, the control circuit 40 may determine a threshold voltage $V_{th}$ of the selected cell (block 230). For example, the control circuit 40 may perform a program verifying read operation to determine if the selected cell appropriately blocks current. If the selected cell passes the threshold voltage test, programming is complete (block 245). If not, however, the control circuit 40 may determine if a maximum loop count has been reached and, if the maximum loop count has been reached, the control circuit 40 may identify a program failure (block 250). If the maximum loop count has not been reached, however, the control circuit 40 may increase the program voltage $V_{pgm}$ (block 235), increment the loop count (block 240), and selectively perform another non-local self-boosting programming operation or a local self-boosting programming operation followed by verification as previously outlined (blocks 225a, 225b, 230).

Figure 3:
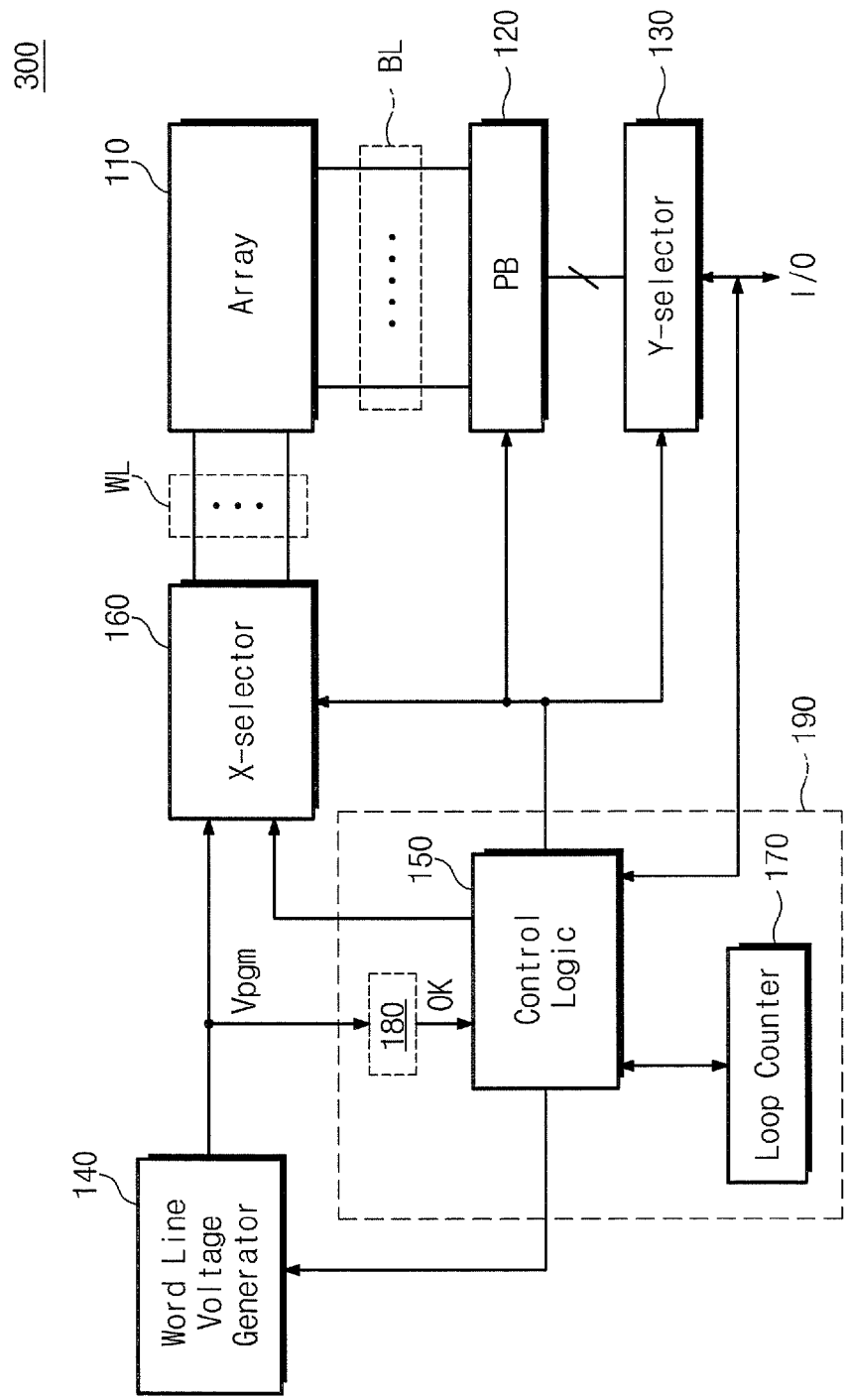
FIG. 3 is a schematic diagram illustrating a memory device according to further embodiments of the present invention.

FIG. 3 illustrates a memory device 300 according to further embodiments of the present invention. In particular, the device 300 is configured to implement an ISPP programming procedure with selective self-boosting along lines described above. The device 300 includes a NAND memory cell array 110 that includes word lines WL and bit lines BL. The bit lines BL are coupled to a page buffer (PB) circuit 120, which sends and receives data to and from a y-selector circuit 130. The PB circuit 120 and y-selector circuit 130 are configured to convey data between the bit lines BL and input/output lines I/O. The device 300 further includes an x-selector circuit 160 that is configured to selectively drive the word lines WL with word line voltages generated by a word line voltage generator circuit 140.

The application of the word line voltages by the x-selector circuit 160 is controlled by a control circuit 190. The control circuit 190 includes a comparator circuit 180 that generates a comparison signal OK responsive to comparison of a program voltage $V_{pgm}$ generated by the word line voltage generation circuit 140 to a predetermined threshold. Responsive to the comparison signal OK, control logic 150 controls application of word line voltages by the x-selector circuit 160 to the word lines WL. The control circuit 190 is further configured to generate a control input to the word line voltage generation circuit 140 to cause it to incrementally increase the program voltage $V_{pgm}$ as part of the ISPP procedure. The control circuit 190 further includes a loop counter circuit 170 that is configured to provide indication to the control logic 150 of the number of times the program voltage $V_{pgm}$ has been indicated to, for example, allow the control logic 150 to identify a programming failure.

Figure 4:
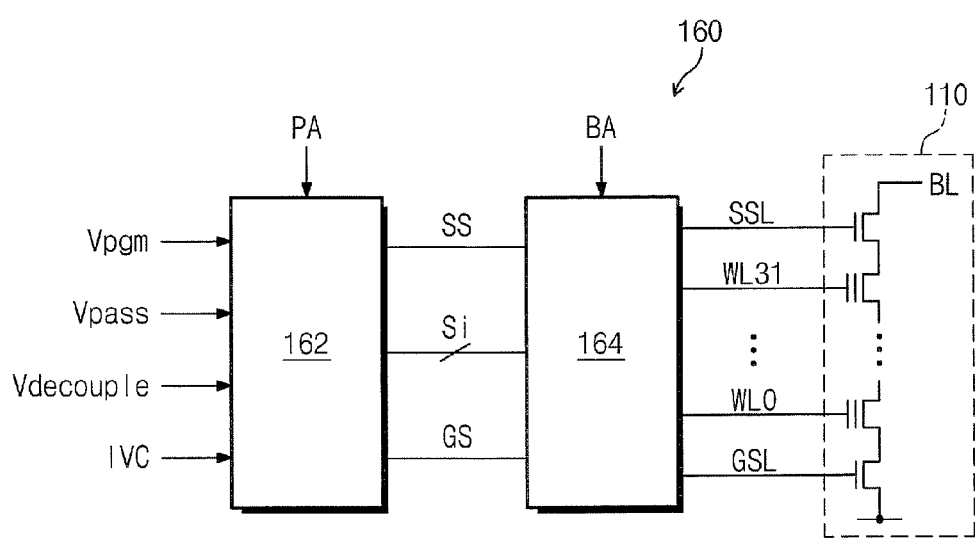
FIG. 4 is a schematic diagram illustrating a word line voltage selection circuit for the memory device of FIG. 3 according to some embodiments of the present invention.

FIG. 4 illustrates an exemplary implementation of the x-selector circuit 160 of the device 300 according to further embodiments of the present invention. The x-selector circuit 160 includes a first decoder/driver circuit 162 that receives a page address PA, along with a program voltage $V_{pgm}$, a pass voltage $V_{pass}$, a decoupling voltage $V_{decouple}$ and an internal voltage IVC generated by the word line voltage generator circuit 140 of FIG. 3. Based on the page address PA, these word line voltages are selectively applied to word line drive signal lines Si. The first decoder/driver circuit 162 also generates voltages on string and ground select drive signal lines SS and GS based on the page address PA. The x-selector circuit 160 further includes a second decoder/driver circuit 164 that receives a block address BA and responsively couples the word line drive signal lines Si and the string and ground select drive signal lines to word lines WL, a string select line SSL and a ground select line GSL, respectively, of the memory array 10.

Figure 5:
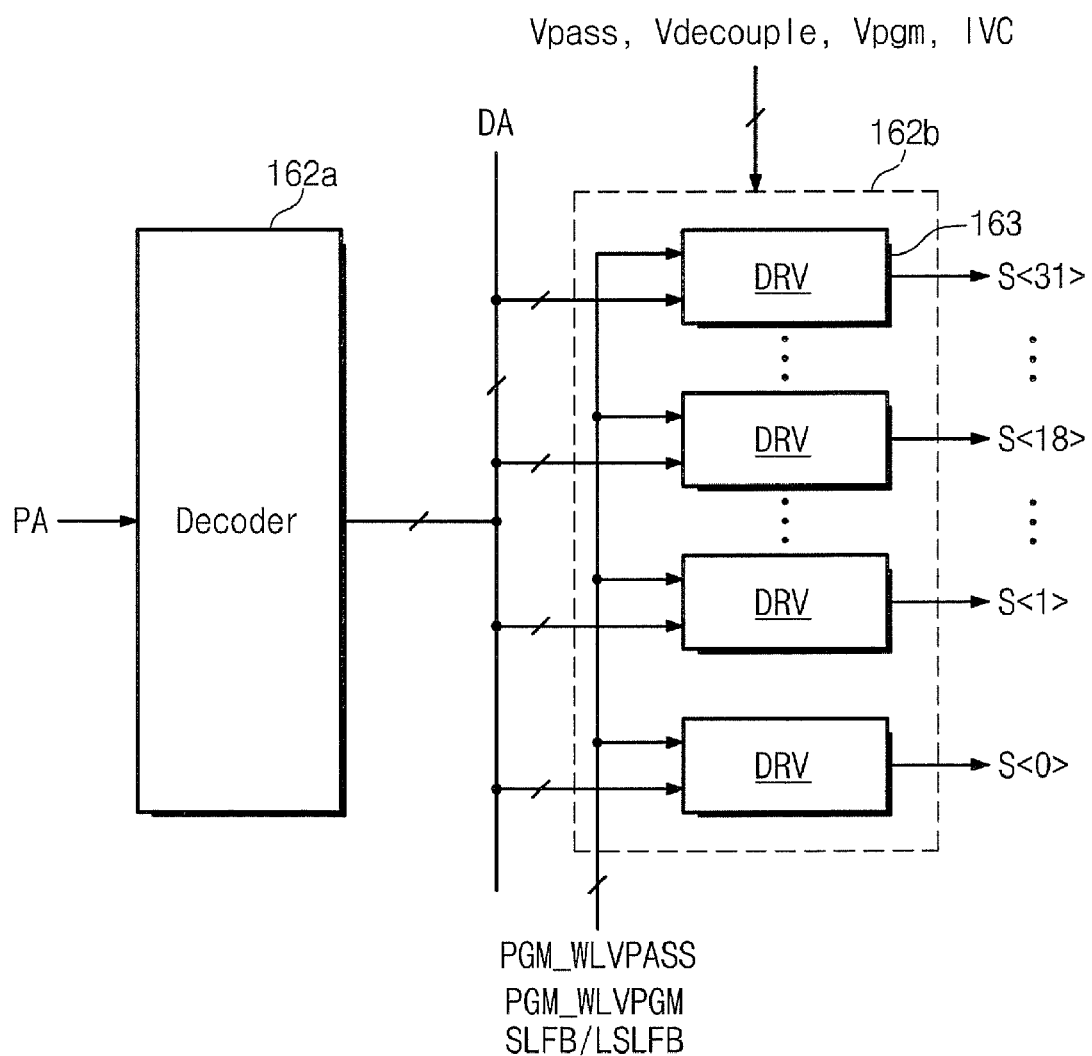
FIGS. 5 and 6 are schematic diagrams illustrating decoder/driver circuits of the word line voltage selection circuit of FIG. 4 according to some embodiments of the present invention.

FIG. 5 illustrates an exemplary implementation of the first decoder/driver circuit 162 according to further embodiments of the present invention. The first decoder/driver circuit 162 includes a page address decoder circuit 162 that receives the page address and responsively generates decoded signals DA. The decoded signals DA are applied to a driver circuit 162b that includes respective drivers DRV having outputs coupled to respective ones of the word line drive signal lines S0-S31. Responsive to the decoded signals DA and control signals PGM_WLVPASS, PGM_WLVPGM, SLFB/LSLFB generated by the control logic 150, the drivers DRV selectively apply the program voltage $V_{pgm}$, pass voltage $V_{pas}$, decoupling voltage $V_{decouple}$ and internal voltage IVC to the word line drive signal lines S0-s31. In particular, the control signal PGM_WLVPASS controls the duration for which the pass voltage Vpass is applied, the control signal PGM_WLVPGM controls the duration for which the program voltage Vpgm is applied, and the control signal SLFB/LSFLB controls whether (non-local) self-boosting or local self-boosting is applied.

Figure 6:
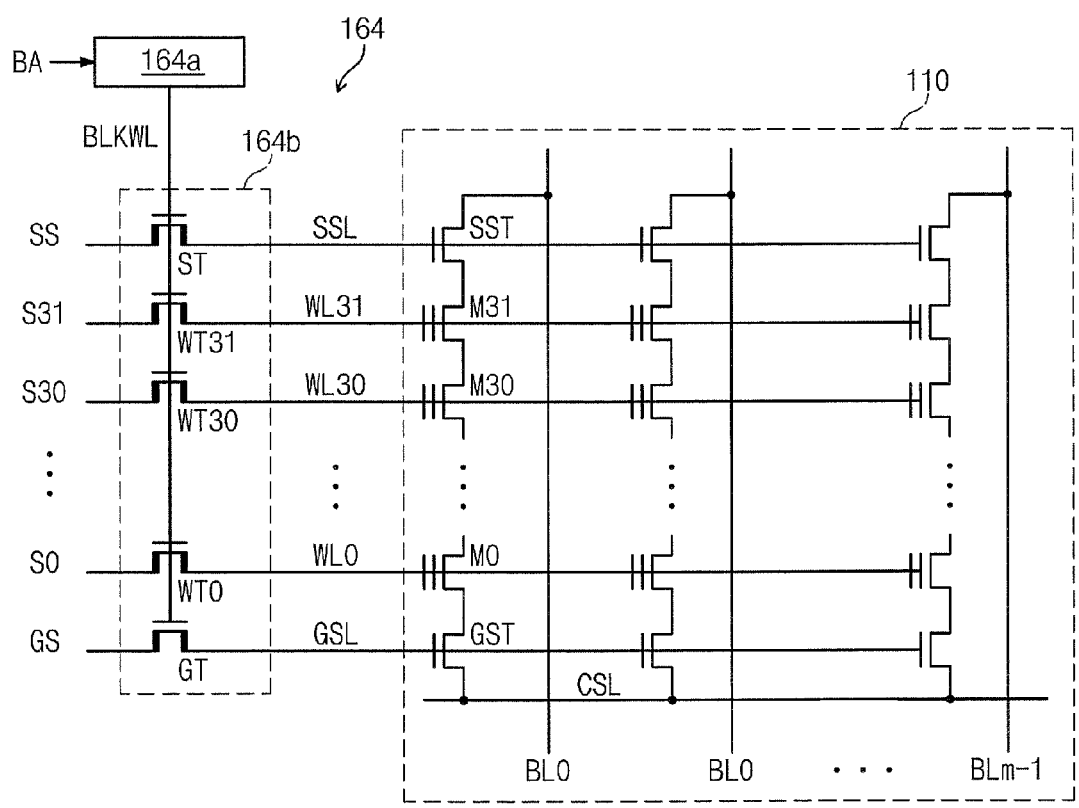

FIG. 6 illustrates an exemplary implementation of the second decoder/driver circuit 164 of FIG. 4. The second decoder/driver circuit 164 includes a block address decoder circuit 164a that receives the block address BA and responsively generates a control signal BLKWL that collectively controls a plurality of pass transistors WT0-WT31, ST, GT that couple and decouple the word line drive signal lines S0-S31, the string select drive signal line SS and the ground select drive signal line GS to the word lines WL0-WL31, the string select line SSL and the ground select line GSL, respectively, of the memory array 110. As shown, the string select line SSL is coupled to string select transistors SST, the word lines WL0-WL31 are connected to memory cells M0-M31, and the ground select line GSL is connected to ground select transistors GST of parallel NAND strings, which are also coupled to respective bit lines BL0-BLm-1.

Figure 7A:
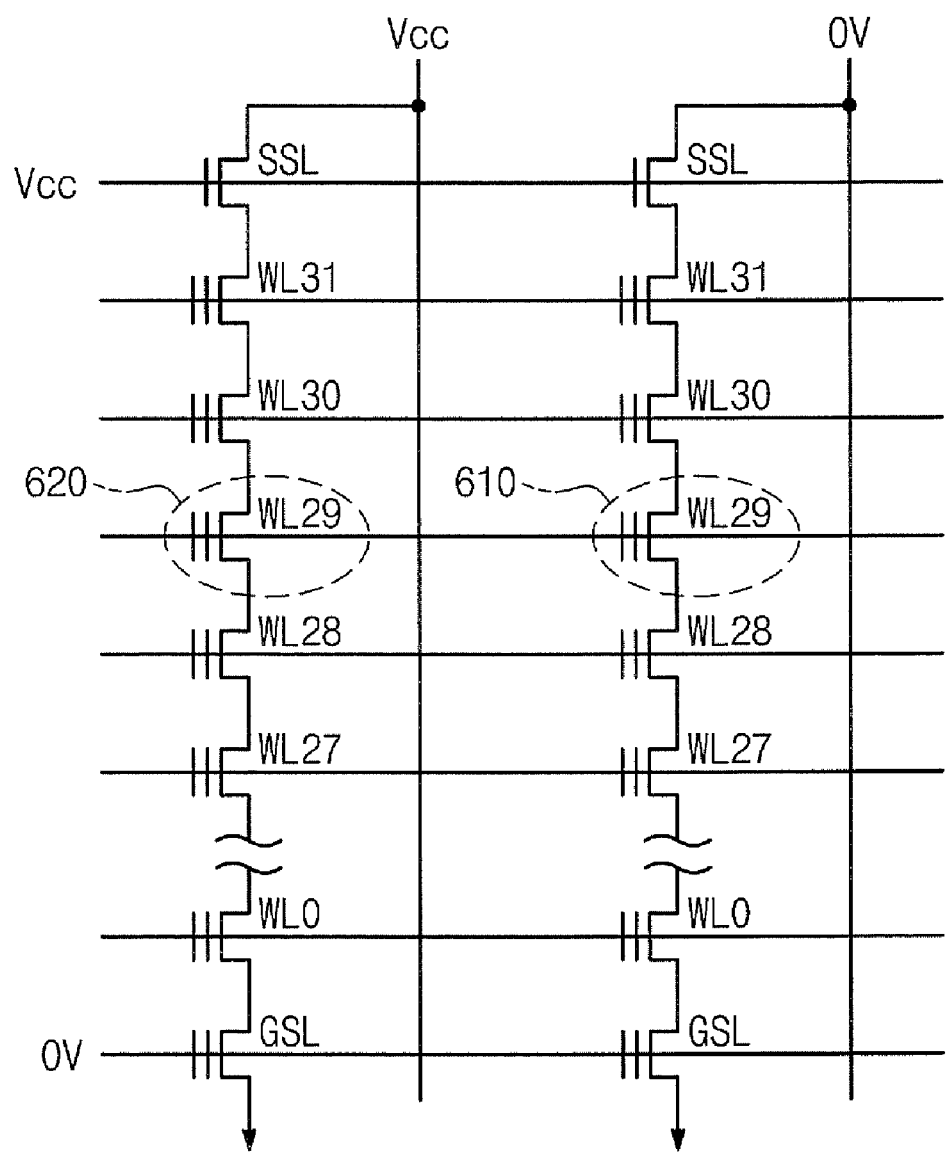
FIGS. 7A-B are schematic and waveform diagrams, respectively, illustrating self-boost program operations of the memory device of FIG. 3 according to some embodiments of the present invention.
Figure 7B:
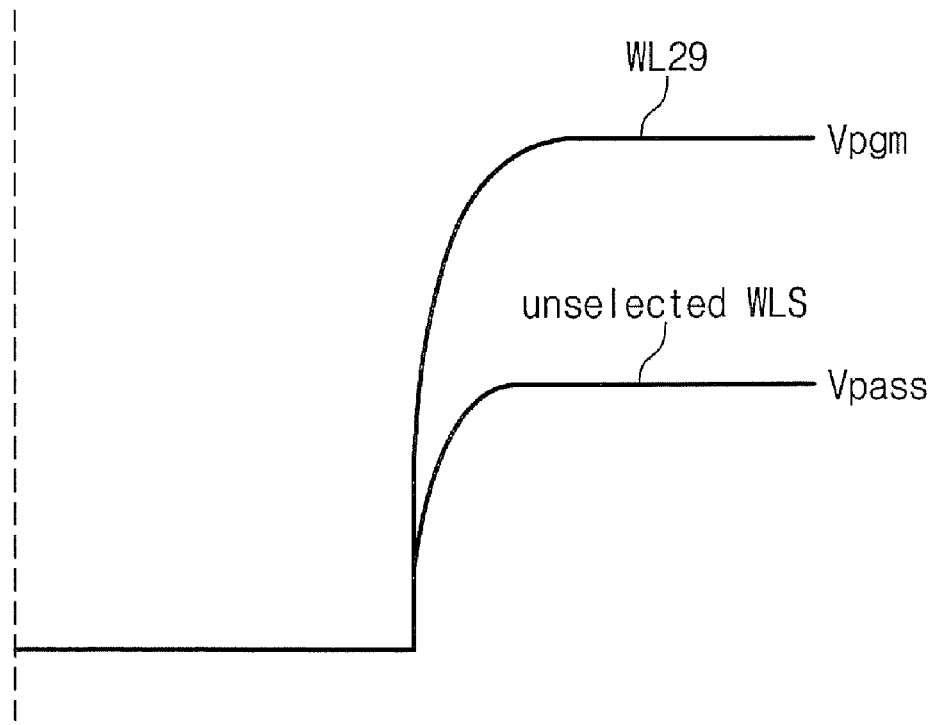

FIGS. 7A-B illustrates exemplary non-local self-boosting operations that may be performed by the memory device 300 of FIG. 3 when the program voltage $V_{pgm}$ is sufficiently low enough to reduce or avoid program disturb. Referring to FIG. 7A, in a programming operation on a target cell 610, the bit line of the NAND string containing the target cell 610 is grounded, while a power supply voltage Vcc is applied to the bit line of an adjacent NAND string. The power supply voltage Vcc is also applied to the string select line SSL, while the ground select line GSL is grounded. This allows the channels of the cells in the non-target string to charge and then float. As shown in FIG. 7B, the program voltage $V_{pgm}$ is then applied to a selected word line WL29 of the target cell 610, while the pass voltage Vpass is applied to the other word lines W0-W28, W30 and W31. This causes the voltages of the channels of the non-selected cell string, including a program-inhibited cell 620 connected to the selected word line WL29, to increase in voltage. If the program voltage $V_{pgm}$ is sufficiently low, the difference between the program voltage $V_{pgm}$ applied to the control gate of the program-inhibited cell 620 and the voltage of its channel may be sufficiently low to prevent inadvertent programming.

Figure 8A:
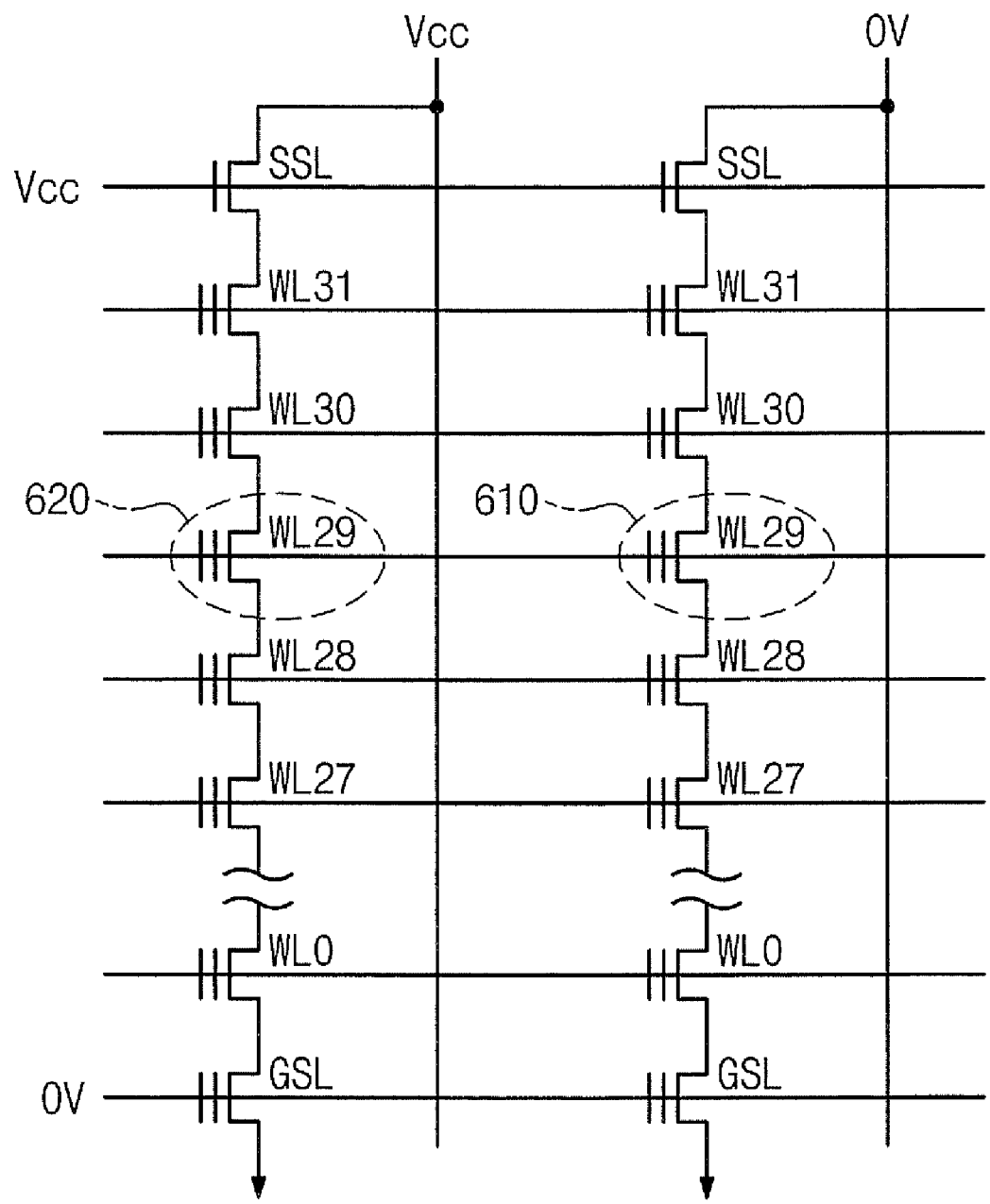
FIGS. 8A-B are schematic and waveform diagrams, respectively, illustrating local self-boost program operations of the memory device of FIG. 3 according to some embodiments of the present invention.
Figure 8B:
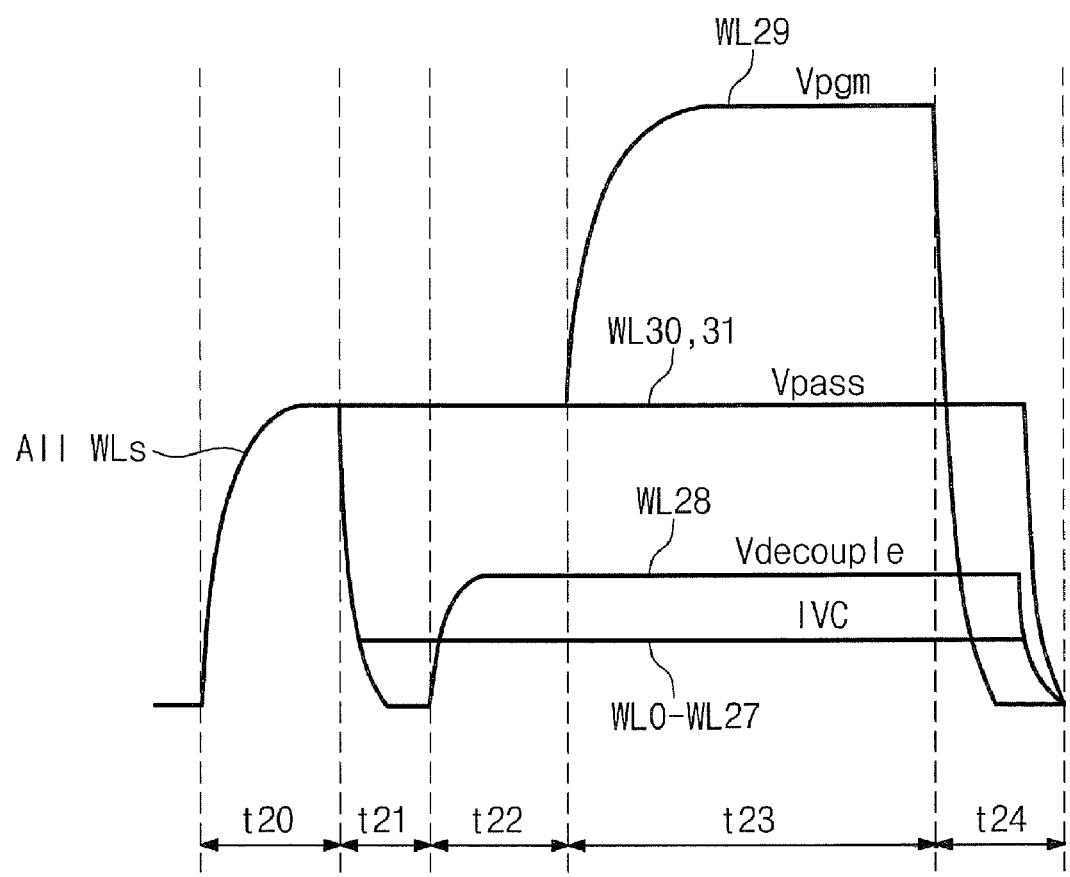

FIGS. 8A-B illustrates exemplary non-local self-boosting operations that may be performed by the memory device 300 of FIG. 3 when the program voltage $V_{pgm}$ is sufficiently high enough that the likelihood of program disturb becomes undesirably great. As shown in FIG. 8A, the bit line of the NAND string containing the target cell 610 is grounded, while a power supply voltage Vcc is applied to the bit line of the adjacent NAND string including the program-inhibited cell 620. The power supply voltage Vcc is also applied to the string select line SSL, while the ground select line GSL is grounded. Referring to FIG. 8B, initially the pass voltage $V_{pass}$ is applied to all of the word lines WL0-WL31. After a time period t20, the word line WL28 adjacent the selected word line WL29 is grounded for a time interval t21, after which it is driven with the decoupling voltage $V_{decouple}$. The word lines WL0-WL27 downstream of the decoupling word line WL28 are driven with the internal voltage IVC, while word lines WL30-WL31 upstream of the selected word line WL29 continue to be driven with the pass voltage $V_{pass}$. In other embodiments, other ones of the downstream word lines WL0-WL27 may, in general, be driven with any combination of the pass voltage $V_{pass}$, the internal voltage IVC and/or the decoupling voltage $V_{decouple}$. After the time interval t22, the selected word line WL29 is driven with the program voltage $V_{pgm}$ for a time interval t23. After the time interval t23 passes, all of the word lines WL0-WL31 are driven to ground during a time interval t24.

Figure 9:
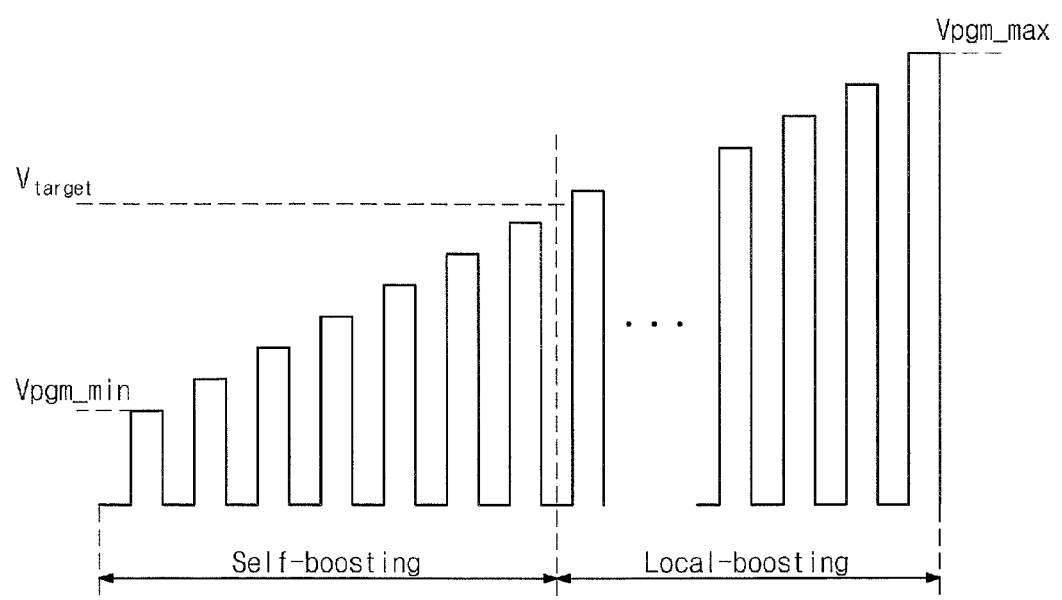
FIG. 9 is a waveform diagram illustrating incremental step-pulse program (ISPP) operations with selective self-boosting according to some embodiments of the present invention.

FIG. 9 further illustrates how the memory device 300 may use ISPP with selective self-boosting according to some embodiments of the present invention. As program voltage $V_{pgm}$ increases from a minimum level $V_{pgm\_min}$ and remains below a target level $V_{target}$, the device 300 uses non-local self-boosting is applied. Once the program voltage $V_{pgm}$ increases above the target level $V_{target}$ toward a maximum program voltage $V_{pgm\_max}$, however, the device 300 uses local self-boosting to reduce the likelihood of program disturb occurring.

It will be understood that the description of the circuitry and operations of FIGS. 3-9 is provided for purposes of illustrations, and that the present invention may be embodied in a variety of other ways. For example, in some embodiments of the present invention, instead of or in addition to selectively applying non-local self-boosting and local self-boosting as described above, a memory device may be configured to selectively employ different non-local self-boosting processes or different local self-boosting processes based on program voltage. Other types of local self boosting, such as the local self-boosting described in the aforementioned U.S. Pat. No. 5,715,194 to Hu and U.S. Pat. No. 6,061,270 to Choi, may be used in lieu or in additional to the local self-boosting techniques described above. In further embodiments, selective self-boosting based on program voltage may be used in programming procedures other than a recursive process, such as an ISPP process.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the novel teachings and advantages of this invention. Accordingly, all such modifications are intended to be included within the scope of this invention as defined in the claims. Therefore, it is to be understood that the foregoing is illustrative of the present invention and is not to be construed as limited to the specific embodiments disclosed, and that modifications to the disclosed embodiments, as well as other embodiments, are intended to be included within the scope of the appended claims.

What is claimed is:

1. A method of operating a flash memory device, the method comprising:
    selectively applying different self-boosting techniques to a string of serially connected memory cells responsive to different voltage levels of a programming voltage applied to a selected word line, wherein selectively applying different self-boosting techniques to a string of serially-connected memory cells responsive to different voltage levels of a programming voltage applied to a selected word line comprises selectively applying non-local self boosting and local self-boosting responsive to different voltage levels of the programming voltage applied to the selected word line, wherein selectively applying non-local self-boosting and local self-boosting comprises selectively applying non-local self-boosting and local self-boosting to a first string of serially-connected cells responsive to different voltage levels of the programming voltage during an incremental step pulse programming (ISPP) of a selected cell of a second string of serially-connected cells and wherein the ISPP programming comprises varying the programming voltage responsive to testing a threshold voltage of the selected cell.

2. A method of operating a flash memory device, the method comprising:
    selectively applying different self-boosting techniques to a string of serially connected memory cells responsive to different voltage levels of a programming voltage applied to a selected word line, wherein selectively applying different self-boosting techniques to a string of serially-connected memory cells responsive to different voltage levels of a programming voltage applied to a selected word line comprises selectively applying non-local self boosting and local self-boosting responsive to different voltage levels of the programming voltage applied to the selected word line and wherein selectively applying non-local self-boosting and local self-boosting comprises:
varying the programming voltage; and
responsive to the varying programming voltage, selectively applying non-local self-boosting and local self-boosting to the string.

3. The method of claim 2, wherein the string of serially-connected cells comprises a first string of serially-connected cells, and wherein varying the programming voltage comprises stepwise changing the programming voltage responsive to testing a threshold voltage of a selected cell of a second string of serially-connected cells.

4. The method of claim 3, further comprising detecting a programming failure responsive to a number of variations of the programming voltage reaching a predetermined number.

5. A method of operating a flash memory device that includes a string of memory cells configured to be connected in series between a bit line and a source line, the method comprising:
applying a programming voltage at a first level to a selected word line that controls a program inhibited cell while applying a pass voltage to word lines that control upstream cells coupled between the bit line and the program inhibited cell and word lines that control downstream cells coupled between the source line and the program inhibited cell; and
subsequently applying the programming voltage to the selected word line at a second level different than the first level while applying a pass voltage to the word lines that control the upstream cells and applying a decoupling voltage to a word line that controls one of the downstream cells.

6. The method of claim 5, wherein subsequently applying the programming voltage to the selected word line at a second level different than the first level while applying a pass voltage to the word lines that control the upstream cells and applying a decoupling voltage to a word line that controls one of the downstream cells comprises:
changing the programming voltage from the first level to the second level; and
responsive to determining that the second level meets a predetermined criterion, applying the programming voltage to the selected word line at the second level while applying the pass voltage to the word lines that control the upstream cells and applying the decoupling voltage to a word line that controls one of the downstream cells.

7. The method of claim 6, wherein the predetermined criterion comprises a voltage threshold criterion.

8. The method of claim 5, wherein subsequently applying the programming voltage to the selected word line at a second level different than the first level while applying a pass voltage to the word lines that control the upstream cells and applying a decoupling voltage to a word line that controls one of the downstream cells comprises subsequently applying the programming voltage to the selected word line at a second level different than the first level while applying a pass voltage to the word lines that control the upstream cells, applying a decoupling voltage to a word line that controls a first downstream cell immediately downstream of the program inhibited cell and applying the pass voltage to a word line that controls a second downstream cell.

9. The method of claim 5, wherein subsequently applying the programming voltage to the selected word line at a second level different than the first level while applying a pass voltage to the word lines that control the upstream cells and applying a decoupling voltage to a word line that controls one of the downstream cells comprises subsequently applying the programming voltage to the selected word line at a second level different than the first level while applying a pass voltage to the word lines that control the upstream cells, applying a decoupling voltage to a word line that controls a first downstream cell immediately downstream of the program inhibited cell and applying a voltage other than the pass voltage, the programming voltage and the decoupling voltage to a word line that controls a second downstream cell.

10. The method of claim 5:
wherein applying a programming voltage at a first level to a selected word line that controls a program inhibited cell while applying a pass voltage to word lines that control upstream cells coupled between the bit line and the program inhibited cell and word lines that control downstream cells coupled between the source line and the program inhibited cell is preceded by:
generating the programming voltage at the first level; and
comparing the first level to a programming voltage threshold;
wherein applying a programming voltage at a first level to a selected word line that controls a program inhibited cell while applying a pass voltage to word lines that control upstream cells coupled between the bit line and the program inhibited cell and word lines that control downstream cells coupled between the source line and the program inhibited cell comprises applying a channel bias voltage to the bit line while applying the programming voltage at the first level to the selected word line and applying the pass voltage to the word lines that control the upstream and downstream cells responsive to the first level being less than the programming voltage threshold;
wherein subsequently applying the programming voltage to the selected word line at a second level different than the first level while applying a pass voltage to the word lines that control the upstream cells and applying a decoupling voltage to a word line that controls one of the downstream cells is preceded by:
performing a threshold voltage test for a selected cell of a second string of serially connected cells;
responsive to determining that a threshold voltage of the selected cell fails to meet a transistor threshold voltage criterion, changing the programming voltage to the second level; and
comparing the second level to the programming voltage threshold; and
wherein subsequently applying the programming voltage to the selected word line at a second level different than the first level while applying a pass voltage to the word lines that control the upstream cells and applying a decoupling voltage to a word line that controls one of the downstream cells comprises applying the programming voltage to the selected word line at the second level while applying the pass voltage to the word lines that control the upstream cells and applying the decoupling voltage to the word line that controls the one of the downstream cells responsive to the second level being greater than the programming voltage threshold.

11. The method of claim 10, further comprising identifying a program failure responsive to a number of variations of the programming voltage applied in programming the selected cell reaching a predetermined number.

12. A flash memory device comprising:
a plurality of strings serially-connected memory cells that share word lines; and
a program circuit configured to selectively apply different self-boosting techniques to a program-inhibited string of the plurality of strings responsive to different voltage levels of a programming voltage applied to a selected word line, wherein the program circuit is configured to selectively apply non-local self-boosting and local self-boosting responsive to different voltage levels of the programming voltage applied to the selected word line, wherein the program circuit is configured to conduct incremental step pulse programming (ISPP) and to selectively apply non-local self-boosting and local self-boosting to a first string of serially-connected memory cells responsive to different voltage levels of the programming voltage during ISPP of a selected cell of a second string of serially-connected cells and wherein the program circuit is configured to vary the programming voltage responsive to testing a threshold voltage of the selected cell.

13. A flash memory device comprising:
a plurality of strings of serially-connected memory cells that share word lines; and
a program circuit configured to selectively apply different self-boosting techniques to a program-inhibited string of the plurality of strings responsive to different voltage levels of a programming voltage applied to a selected word line, wherein the program circuit is configured to selectively apply non-local self-boosting and local self-boosting responsive to different voltage levels of the programming voltage applied to the selected word line, wherein the program circuit is configured to conduct incremental step pulse programming (ISPP) and to selectively apply non-local self-boosting and local self-boosting to a first string of serially-connected memory cells responsive to different voltage levels of the programming voltage during ISPP of a selected cell of a second string of serially-connected cells and wherein the program circuit is configured to identify a program failure responsive to a number of variations of the programming voltage reaching a predetermined number.

14. A flash memory device comprising:
a plurality of strings of serially-connected cells that share word lines; and
a program circuit configured to selectively apply different self-boosting techniques to a program-inhibited string of the plurality of strings responsive to different voltage levels of a programming voltage applied to a selected word line, wherein the program circuit is configured to selectively apply non-local self-boosting and local self-boosting responsive to different voltage levels of the programming voltage applied to the selected word line and wherein the program circuit is configured to vary the programming voltage and, responsive to the varying programming voltage, to selectively apply non-local self-boosting and local self-boosting to the string.

15. The memory device of claim 14, wherein the program circuit is configured to stepwise change the programming voltage responsive to testing a threshold voltage of a selected cell.

16. A flash memory device comprising:
a plurality of strings of serially memory cells that share word lines; and
a program circuit configured to selectively apply different self-boosting techniques to a program-inhibited string of the plurality of strings responsive to different voltage levels of a programming voltage applied to a selected word line, wherein the program circuit is configured to selectively apply non-local self-boosting and local self-boosting responsive to different voltage levels of the programming voltage applied to the selected word line and wherein the program circuit comprises:
a word line voltage generator circuit configured to generate the programming voltage, a pass voltage, and a decoupling voltage and to vary the programming voltage responsive to a programming voltage control signal;
a selector circuit coupled to the word line voltage generator circuit and configured to selectively apply the programming voltage, the pass voltage and the decoupling voltage to the word lines of the plurality of serially-connected strings responsive to a selection control signal; and
a control circuit configured to generate the programming voltage control signal and the selection control signal.

17. The memory device of claim 16, wherein the plurality of strings are arranged as a block of memory cells of a plurality of blocks of memory cells of the memory device, and wherein the selector circuit comprises:
a first decoder circuit configured receive the programming voltage, the pass voltage and the decoupling voltage and to selectively pass the programming voltage, the pass voltage and the decoupling voltage to a plurality of intermediate word lines responsive to the selection control signal;
a second decoder circuit coupled to the intermediate word lines and configured to couple the intermediate word lines to the word lines of the plurality of strings responsive to a block address signal.

18. The memory device of claim 17, wherein the first decoder circuit is further configured to generate string select and ground select signals responsive to a page address signal.

19. A flash memory device comprising:
a plurality of strings of serially-connected memory cells that share word lines, each string of memory cells configured to be connected in series between a bit line and a source line; and
a program circuit configured to apply a programming voltage at a first level to a selected word line that controls a program inhibited cell while applying a pass voltage to word lines that control upstream cells coupled between the bit line and the program inhibited cell and word lines that control downstream cells coupled between the source line and the program inhibited cell and to subsequently apply the programming voltage to the selected word line at a second level different than the first level while applying a pass voltage to the word lines that control the upstream cells and applying a decoupling voltage to a word line that controls one of the downstream cells.

20. The memory device of claim 19, wherein the program circuit is configured to change the programming voltage from the first level to the second level and, responsive to determining that the second level meets a predetermined criterion, to apply the programming voltage to the selected word line at the second level while applying the pass voltage to the word lines that control the upstream cells and applying the decoupling voltage to a word line that controls one of the downstream cells.

21. The memory device of claim 20, wherein the predetermined criterion comprises a voltage threshold criterion.

22. The memory device of claim 19, wherein the program circuit is configured to apply a programming voltage at a first level to a selected word line that controls a program inhibited cell while applying a pass voltage to word lines that control upstream cells coupled between the bit line and the program inhibited cell and word lines that control downstream cells coupled between the source line and the program inhibited cell and to subsequently apply the programming voltage to the selected word line at a second level different than the first level while applying a pass voltage to the word lines that control the upstream cells, applying a decoupling voltage to a word line that controls a first downstream cell immediately downstream of the program inhibited cell and applying the pass voltage to a word line that controls a second downstream cell.

23. The memory device of claim 19, wherein the program circuit is configured to apply a programming voltage at a first level to a selected word line that controls a program inhibited cell while applying a pass voltage to word lines that control upstream cells coupled between the bit line and the program inhibited cell and word lines that control downstream cells coupled between the source line and the program inhibited cell and to subsequently apply the programming voltage to the selected word line at a second level different than the first level while applying a pass voltage to the word lines that control the upstream cells, applying a decoupling voltage to a word line that controls a first downstream cell immediately downstream of the program inhibited cell and applying a voltage other than the pass voltage, the programming voltage and the decoupling voltage to a word line that controls a second downstream cell.

24. The memory device of claim 19, wherein the program circuit is configured to generate the programming voltage at the first level, to compare the first level to a programming voltage threshold, to apply a channel bias voltage to the bit line while applying the programming voltage at the first level to the selected word line and applying the pass voltage to the word lines that control the upstream and downstream cells responsive to the first level being less than the programming voltage threshold, to perform a threshold voltage test for a selected cell of a second string of serially-connected cells, to change the programming voltage to the second level responsive to determining that a threshold voltage of the selected cell fails to meet a transistor threshold voltage criterion, to compare the second level to the programming voltage threshold and to apply the programming voltage to the selected word line at the second level while applying the pass voltage to the word lines that control the upstream cells and applying the decoupling voltage to the word line that controls the one of the downstream cells responsive to the second level being greater than the programming voltage threshold.

25. The memory device of claim 24, wherein the program circuit is configured to identify a program failure responsive to a number of variations of the programming voltage applied in programming the selected cell reaching a predetermined number.

* * * * *